US008396112B2

(12) United States Patent
Takeuchi

(10) Patent No.: US 8,396,112 B2
(45) Date of Patent: Mar. 12, 2013

(54) CIRCUITRY AND METHOD FOR TRANSFERRING DATA, AND CIRCUITRY AND METHOD UTILIZING CLOCK PULSES

(75) Inventor: Kesatoshi Takeuchi, Shiojiri (JP)

(73) Assignee: Seiko Epson Corporation (JP)

( * ) Notice: Subject to any disclaimer, the term of this patent is extended or adjusted under 35 U.S.C. 154(b) by 1399 days.

(21) Appl. No.: 11/975,339

(22) Filed: Oct. 18, 2007

(65) Prior Publication Data
US 2008/0122509 A1    May 29, 2008

(30) Foreign Application Priority Data

Nov. 28, 2006  (JP) ................................. 2006-319718
Nov. 28, 2006  (JP) ................................. 2006-319722
Sep. 20, 2007  (JP) ................................. 2007-243339

(51) Int. Cl.
*H04B 1/66* (2006.01)
(52) U.S. Cl. ...................................................... 375/240
(58) Field of Classification Search ............. 375/219, 375/224, 355; 327/158
See application file for complete search history.

(56) References Cited

U.S. PATENT DOCUMENTS

| 4,810,977 | A  | * | 3/1989  | Flugstad et al. ............... 332/127 |
| 5,052,021 | A  | * | 9/1991  | Goto et al. ..................... 375/317 |
| 5,295,155 | A  | * | 3/1994  | Gersbach et al. .............. 375/214 |
| 5,727,193 | A  |   | 3/1998  | Takeuchi |
| 6,157,688 | A  |   | 12/2000 | Tamura et al. |
| 6,317,469 | B1 | * | 11/2001 | Herbert .......................... 375/293 |
| 6,377,638 | B1 |   | 4/2002  | Tamura et al. |
| 6,477,205 | B1 | * | 11/2002 | Doblar et al. .................. 375/259 |
| 6,493,394 | B2 |   | 12/2002 | Tamura et al. |
| 6,518,893 | B1 | * | 2/2003  | Robinson ......................... 341/56 |
| 7,823,003 | B1 | * | 10/2010 | Cheng ............................. 713/600 |
| 8,139,684 | B2 | * | 3/2012  | Lee et al. ........................ 375/322 |
| 2003/0011426 | A1 | * | 1/2003  | Casper ............................. 330/9 |
| 2005/0033171 | A1 | * | 2/2005  | Stergiopoulos et al. ....... 600/437 |
| 2005/0259772 | A1 | * | 11/2005 | Voutilainen ................... 375/353 |
| 2006/0038596 | A1 | * | 2/2006  | Wang ............................. 327/158 |
| 2006/0229033 | A1 | * | 10/2006 | Carragher et al. .............. 455/86 |

(Continued)

FOREIGN PATENT DOCUMENTS

| JP | 04-277931 | 10/1992 |
| JP | 07-193605 | 7/1995 |

(Continued)

*Primary Examiner* — Jaison Joseph
(74) *Attorney, Agent, or Firm* — Harness, Dickey & Pierce, P.L.C.

(57) ABSTRACT

A variable power supply voltage generator generates a variable power supply voltage Vvar and supplies it to other circuits. A transmitting circuit 130 (or 140), operative at the variable power supply voltage Vvar, generates multi-value analog signals Smulti and transmits them to other circuits. A receiving circuit 140 (or 130), operative at the variable power supply voltage Vvar, receives the multi-value analog signals Smulti and subjects them to A/D conversion to generate multi-value digital signals. The threshold voltage generator generates threshold voltages used for A/D conversion from the variable power supply voltage Vvar or from a signal having a voltage value proportional to that of the variable power supply voltage Vvar and supplies them to the receiving circuit. An analog clock generator 120 generates an analog clock signal having a cyclical analog waveform. In response to the analog clock signal, a clock pulse generator 150 generates a clock pulse signal having a cycle period of 1/N of the cycle period of the analog clock signal. The clock-synchronous circuits 130, 140 operate synchronously with the clock pulse signals generated by the clock pulse generator 150.

15 Claims, 16 Drawing Sheets

U.S. PATENT DOCUMENTS

| | | | |
|---|---|---|---|
| 2007/0121714 A1* | 5/2007 | Baker et al. | 375/224 |
| 2007/0147477 A1* | 6/2007 | Cavallaro et al. | 375/130 |

FOREIGN PATENT DOCUMENTS

| | | |
|---|---|---|
| JP | 08-044465 | 2/1996 |
| JP | 08-44465 | 2/1996 |
| JP | 2000-47768 | 2/2000 |
| JP | 2001-285388 | 10/2001 |
| JP | 2002-152029 | 5/2002 |
| JP | 2004-355647 | 12/2004 |
| JP | 2006-259753 | 9/2006 |

* cited by examiner

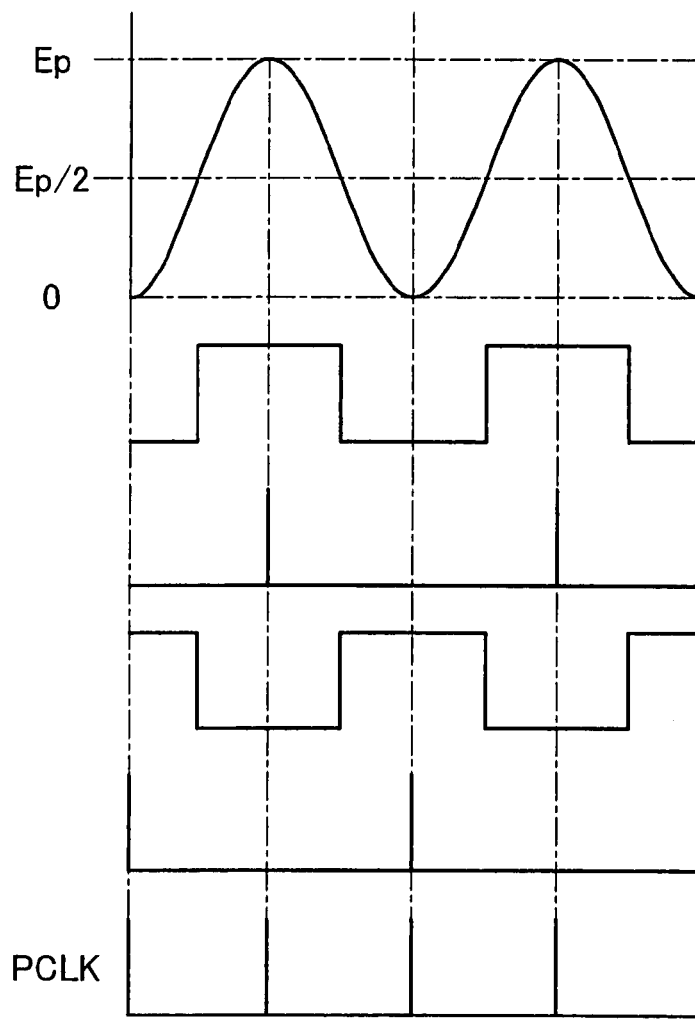
Fig.6A Swave
Fig.6B Comparison signal S110
Fig.6C Top peak signal S111U
Fig.6D /S110
Fig.6E Bottom peak signal S111D
Fig.6F Specified phase clock PCLK

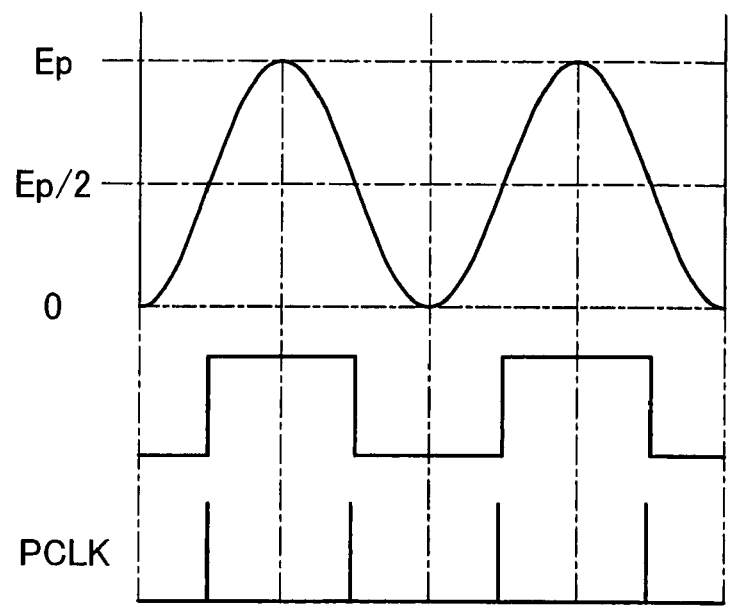
Fig. 7A  Swave
Fig. 7B  Comparison signal S110
Fig. 7C  Specified phase clock  PCLK

CIRCUITRY AND METHOD FOR TRANSFERRING DATA, AND CIRCUITRY AND METHOD UTILIZING CLOCK PULSES

CROSS-REFERENCE TO RELATED APPLICATIONS

The present application claims the priority based on Japanese Patent Applications No. 2006-319718 and No. 2006-319722 both filed on Nov. 28, 2006, and No. 2007-243339 filed on Sep. 20, 2007, the disclosures of which are hereby incorporated by reference in its entirety.

BACKGROUND OF THE INVENTION

1. Field of the Invention

The present invention relates to a circuitry for transferring data and method for the same, as well as to a circuitry that uses clock pulses and method for the same.

2. Description of the Related Art

Data transfer is commonly carried out using digital signals. However, in recent years, it has been attempted to perform data transfer using multi-value analog signals (see, for example, JPA07-193605, JPA2000-47768, JPA2001-285388 and JPA2002-152029). Furthermore, in order to reduce power consumption in a computer system, a technology is used that makes the power supply voltage supplied to the various circuit in the system variable (JPA08-44465).

However, in the device using variable power supply voltage, the problem arises that it is difficult to consistently convert the multi-value analog signals into multi-value digital signals because the power supply voltage changes.

Incidentally, it is well known that in most devices using electronic signals and optical signals, individual circuits operate synchronously with clock pulses (see JPA2006-259753, for example).

However, when high-frequency clock pulses are transmitted to a large number of circuits in such devices, high-harmonic noise can easily occur and the pulse waveform tends to easily deteriorate.

SUMMARY OF THE INVENTION

A first object of the present invention is to provide a technology that enables multi-value analog signals to be properly converted into multi-value digital signals in a circuitry that uses variable power supply voltage.

A second object of the present invention is to provide a technology that reduces transmission distance of clock pulses.

According to one aspect of the present invention, there is provided a circuitry for transferring data that comprises a variable power supply voltage generator, a transmitting circuit, a receiving circuit, and a threshold voltage generator. The variable power supply voltage generator generates a variable power supply voltage. The transmitting circuit is operative at the variable power supply voltage, and generate a multi-value analog signal and transmits the multi-value analog signal to other circuits. The receiving circuit is operative at the variable power supply voltage, and receives the multi-value analog signal and performs A/D conversion to re-generate a multi-value digital signal. The threshold voltage generator generates threshold voltages used for the A/D conversion and supplies the threshold voltages to the receiving circuit, wherein the threshold voltages are generated from the variable power supply voltage or from a signal having a voltage value proportional to the variable power supply voltage.

According to this circuitry, because threshold voltages used for A/D conversion are generated from a signal having a variable power supply voltage or a voltage value proportional to a variable power supply voltage, multi-value analog signals can be properly reconverted into multi-value digital signals by the receiving circuit.

The circuitry may further comprises a sine wave clock generator for generating a sine wave clock signal and sending the sine wave signal to the transmitting circuit and the receiving circuit, wherein the sine wave clock signal has a cycle period that increases as the variable power supply voltage decreases. The transmitting circuit and the receiving circuit may respectively generate a clock pulse signal having a cycle period equal to 1/N of the cycle period of the sine wave clock signal where N is a value of 2 or greater, and perform operations in synchronism with the clock pulse signal.

According to this construction, because the frequencies of the sine wave clock signal and the clock pulse signal change in response to the variable power supply voltage, power consumption can be reduced utilizing the effects of both the variable power supply voltage and the clock signals.

The sine wave clock signal may have a peak voltage proportional to the variable power supply voltage, and the threshold voltage generator may generate the threshold voltages based on the peak voltage of the sine wave clock signal.

According to this construction, appropriate threshold voltages used in A/D conversion can be generated from a sine wave clock signal.

According to another aspect of the present invention, there is provided a circuitry using clock pulses that comprises an analog clock generator, a clock pulse generator, and a clock-synchronous circuit. The analog clock generator generates an analog clock signal having a cyclical analog waveform. The clock pulse generator generates, responsive to the analog clock signal, a clock pulse signal having a cycle period equal to 1/N of a cycle period of the analog clock signal where N is a value of 2 or greater. The clock-synchronous circuit is operative in synchronism with the clock pulse signal.

According to this circuitry, because a clock signal is transmitted in the form of an analog clock signal, and a clock pulse signal is generated from this analog clock signal and used in the clock-synchronous circuit, the clock pulse transmission distance can be substantially reduced.

The analog clock generator may be operative to change the cycle period of the analog clock signal, and the cycle period of the clock pulse signal may be changed according to the change in the cycle period of the analog clock signal.

According to this construction, by changing the frequency of the analog clock signal in accordance with the objective of reducing power consumption or the like, the frequency of the clock signal used by clock-synchronous circuits can be changed.

The circuitry may comprises a plurality of the clock-synchronous circuits including first and second clock-synchronized circuits, wherein the clock pulse generator is disposed in each clock-synchronous circuit.

According to this construction, because a clock pulse generator is disposed in each clock-synchronous circuit, the clock pulse signal transmission distance between can be further reduced.

The value N may be established independently for each clock pulse generator.

With this construction, a clock pulse signal having a frequency suited to each individual clock-synchronous circuit can be generated.

The first clock-synchronous circuit may include a multi-value analog signal generator for generating a multi-value analog signal that represents digital values to be transmitted to the second clock-synchronous circuit. The multi-value analog signal generator is operative in synchronism with a first clock pulse signal generated by a first clock pulse generator that is disposed for the first clock-synchronous circuit. In this case, the second clock-synchronous circuit may include a multi-value digital signal generator for converting the multi-value analog signal into a multi-value digital signal. The multi-value digital signal generator is operative in synchronism with a second clock pulse signal generated by a second clock pulse generator that is disposed for the second clock-synchronous circuit.

According to this construction, because data transfer between the first and second clock-synchronous circuits can be carried out using the multi-value analog signal, the number of signal lines used for the data transfer can be reduced, and high-harmonic noise can be further reduced.

The analog clock signal may have a sine wave waveform.

With this construction, reduction in high-harmonic noise and minimization of pulse-waveform deterioration can be achieved with maximum efficiency.

The present invention may be realized in various forms, such as in the form of a method, a circuitry, a circuit assembly, a device, a computer program that executes the functions of this method, circuitry, circuit assembly or device, and a recording medium on which such computer program is recorded, for example.

These and other objects, features, aspects, and advantages of the present invention will become more apparent from the following detailed description of the preferred embodiments with the accompanying drawings.

BRIEF DESCRIPTION OF THE DRAWINGS

FIGS. 6A-6F are timing charts showing examples of the operation of a specified phase signal generator;

FIGS. 7A-7C are timing charts showing other examples of the operation of the specified phase signal generator;

DESCRIPTION OF THE PREFERRED EMBODIMENT

Figure 1:
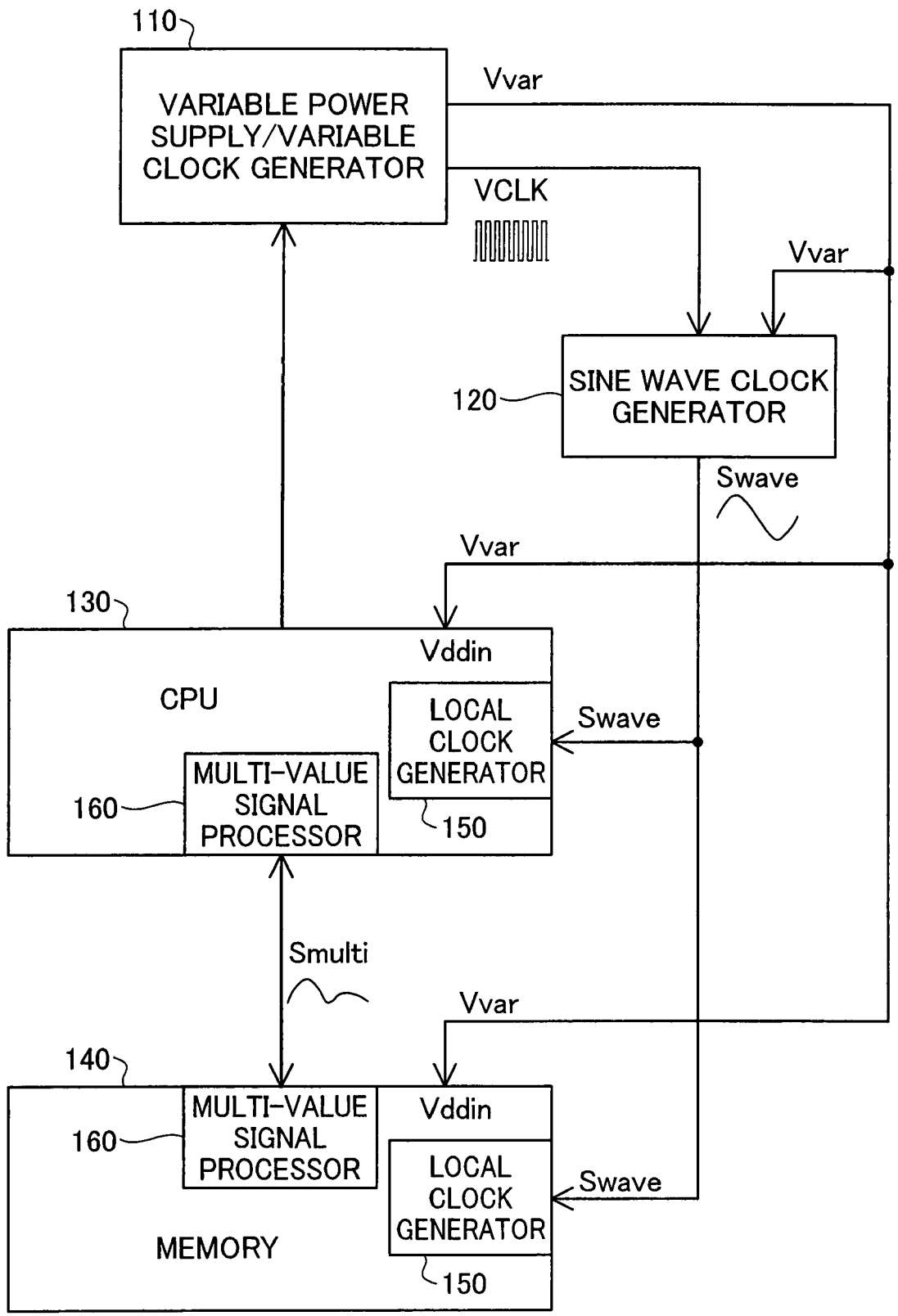
FIG. 1 is a block diagram showing the construction of a computer system comprising an embodiment of the present invention.

Embodiments of the present invention will be described in the order below.
A. Device construction and operation
B. Internal construction and operation of specified phase signal generator
C. Variations A. Device Construction and Operation FIG. 1 is a block diagram showing the construction of a computer system comprising an embodiment of the present invention. This computer system includes a variable voltage/variable clock generator 110, a sine wave clock generator 120, a CPU 130 and a memory circuit 140.

The variable voltage/variable clock generator 110 generates a variable power supply voltage Vvar that is used by multiple circuits in the computer system, and a variable clock signal VCLK whose frequency is linked to the level of the variable power supply voltage Vvar. The variable power supply voltage Vvar is supplied to the power supply voltage terminals Vddin of other circuits. The sine wave clock generator 120 generates a since wave clock signal Swave whose frequency is linked to the cycle of the variable clock signal VCLK.

A local clock generator 150 and a multi-value signal generator 160 are disposed in the CPU 130 and the memory circuit 140, respectively. The local clock generator 150 generates a local clock pulse having a cycle period that is 1/N of the cycle period of the sine wave clock signal Swave, where N has a value equal to or greater than 2. The CPU 130 and memory circuit 140 are circuit units that operate synchronously with local clock pulses generated by the local clock generators 150 in the respective units. The multi-value signal processing circuits 160 in the CPU 130 and memory circuit 140 generate multi-value analog signals Smulti expressing digital values to be transferred, and transfer these multi-value analog signals Smulti to the multi-value signal processing circuit 160 on the other circuit. The multi-value signal processing circuits 160 also re-convert the multi-value analog signals Smulti to multi-value digital signals when they are received. The multi-value analog signals Smulti are signals having a multi-value signal level of three or higher.

It is preferred that the CPU 130 and memory circuit 140 each is constructed as a single-chip semiconductor circuit. In such a case, it is further preferred that the local clock generator 150 be implemented in the same chip.

Figure 2:
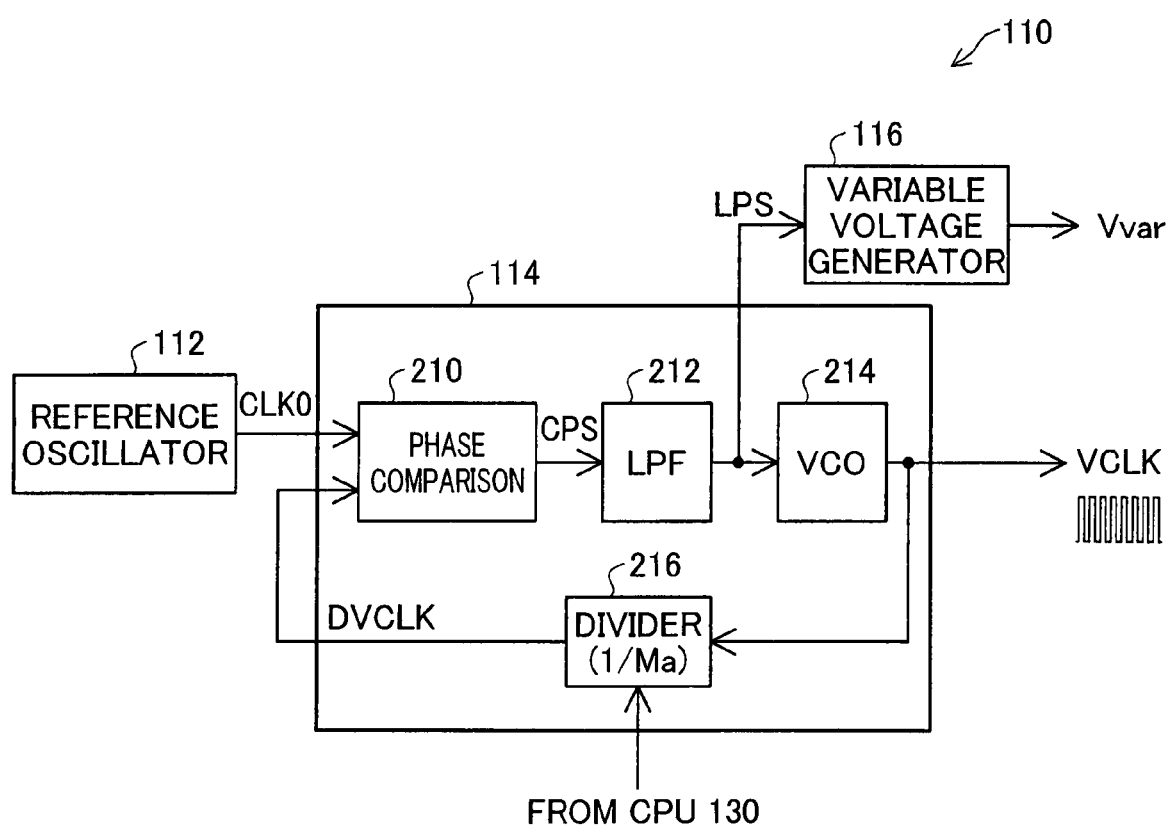
FIG. 2 is a block diagram showing the internal construction of a variable voltage/variable clock generator.

FIG. 2 is a block diagram showing the internal construction of the variable voltage/variable clock generator 110 (see FIG. 1). The variable voltage/variable clock generator 110 includes a reference oscillator 112, a PLL circuit 114 and a variable voltage generator 116. The PLL circuit 114 includes a phase comparator 210, a loop filter (LPF) 212, a voltage control oscillator (VCO) 214, and a frequency divider 216.

The divider 216 is connected to the CPU 130 via a bus, and stores a division value Ma that is set by the CPU 130. The reference oscillator 112, which includes an oscillator such as a crystal oscillator, generates a reference clock signal CLK0 having a fixed frequency.

The reference clock signal CLK0 is input to the phase comparator 210 as a reference signal. At the same time, the divided signal DVCLK generated by the divider 216 is input to the phase comparator 210 as a comparison signal. The phase comparator 210 generates a difference signal CPS that indicates the phase difference between the two signals CLK0 and DVCLK. The difference signal CPS is sent to the loop filter 212, which incorporates a charge pump circuit. The loop filter 212 generates and outputs a voltage control signal LPS having a voltage level corresponding to the pulse level and number of pulses of the difference signal CPS.

The voltage control signal LPS is supplied to the voltage control oscillator (VCO) 214 and to the variable voltage generator 116. The voltage control oscillator 214 outputs a variable clock signal VCLK having a frequency corresponding to the voltage level of the voltage control signal LPS. The frequency of the variable clock signal VCLK is divided by Ma with the divider 216 to generate a frequency-divided signal DVCLK. This frequency-divided signal DVCLK is sent to the phase comparator 210 and undergo phase comparison with the reference clock signal CLK0, as described above. As a result, the frequencies of the variable clock signal VCLK converge such that the phase difference between the two signals CLK0 and DVCLK becomes zero. The frequency of the converged variable clock signal VCLK becomes the product of the frequency of the reference clock signal CLK0 and the division value Ma. The CPU 130 can rewrite the division value Ma in the divider 216 in order to set the frequency of the variable clock signal VCLK to a desired value. For example, where the operating mode shifts to a lower-power consumption mode, the division value Ma is set to a smaller value.

The variable voltage generator 116 controls the level of the output voltage Vvar in response to the voltage level of the voltage control signal LPS supplied from the loop filter 212. This variable voltage generator 116 can be realized via a DC-DC converter, for example. The generated variable power supply voltage Vvar is supplied to the various circuits 120, 130, 140 in the computer system. In other words, these circuits operate based on the variable power supply voltage Vvar supplied to their power supply voltage terminals Vddin. As is well known, the power consumption of each circuit depends on the power supply voltage level. Therefore, by reducing the level of the variable power supply voltage Vvar, the power consumption of these circuits can be reduced.

In this embodiment, the frequency of the variable clock signal VCLK is also controlled in response to the voltage level of the voltage control signal LPS. In other words, the frequency of the variable clock signal VCLK is associated with the system's variable power supply voltage Vvar, and the frequency of the variable clock signal VCLK drops as the variable power supply voltage Vvar falls. This variable clock signal VCLK is converted into a sine wave clock signal Swave by the sine wave clock generator 120 (see FIG. 1), and supplied to the individual local clock generators 150, and are converted into local clock pulses by these circuits 150. Therefore, the local clock pulses comprise a clock having a frequency proportional to the frequency of the variable clock signal VCLK. As can be understood from this explanation, the various circuits in the computer system (such as the CPU 130 and the memory circuit 140) operate based on the variable power supply voltage Vvar, and operate synchronously with local clock pulses having a frequency proportional to the frequency of the variable clock signal VCLK. Because these circuits operate at a speed proportional to the frequency of the variable clock signal VCLK, their power consumption is also reduced in accordance with the reduction in the frequency of the variable clock signal VCLK. Furthermore, because the variable power supply voltage Vvar is reduced together with the reduction in the frequency of the variable clock signal VCLK, the power consumption of the various circuits 130, 140 can be further reduced.

Figure 3:
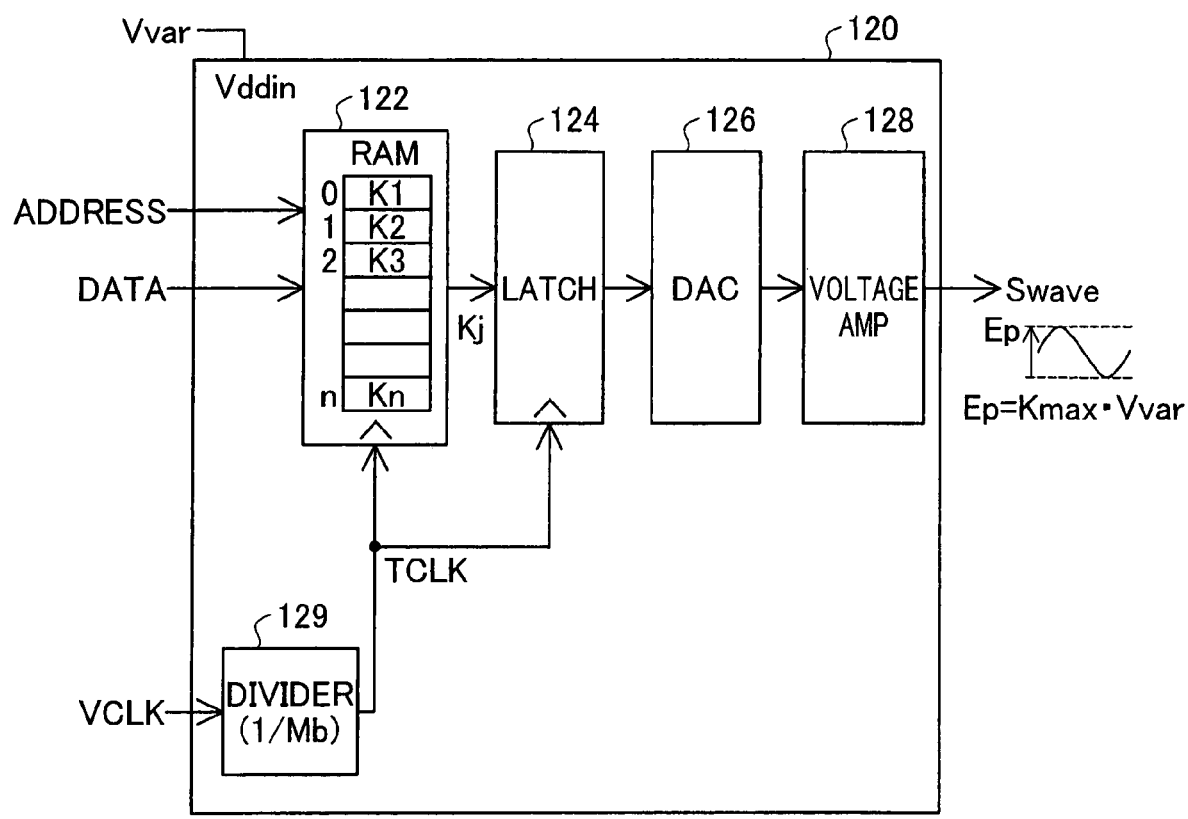
FIG. 3 is a block diagram showing the internal construction of a sine wave clock generator.

FIG. 3 is a block diagram showing the internal construction of the sine wave clock generator 120 (see FIG. 1). The sine wave clock generator 120 includes a RAM 122, a latch 124, a D/A converter 126, a voltage amplifier 128 and a divider 129. A plurality of waveform values K1-Kn expressing sine wave waveforms are stored in the RAM 122. These n number of waveform values K1-Kn can be rewritten as necessary by the CPU 130.

A non-volatile memory such as an EEPROM may be used instead of the RAM 122. If a non-volatile memory is used, waveforms that match the waveform characteristics of the circuit board or circuit substrate used in the system may be realized by writing the waveform configurations at the time of shipment. In addition, regarding the waveform values K1-Kn, it is acceptable if, out of a given cycle period of $2\pi$, only the value for a quarter of that cycle period (such as the period from phase 0 to $\pi/2$, for example) is stored and the waveforms for the other periods ($\pi/2$-$\pi$, $\pi$-$3\pi/2$, $3\pi/2$-$2\pi$) are determined via calculation. In this case, the memory capacity can be reduced.

The frequency divider 129 generates a timing clock TCLK by dividing the frequency of the variable clock signal VCLK by Mb. The division value Mb is preferably a prescribed fixed value. However, the division value Mb may be freely rewritten by the CPU 130. In addition, the divider 129 may be omitted.

The RAM 122 increments the read-out address j, where j ranges from 1-n, one at a time synchronously with the pulses of this timing clock TCLK and outputs a waveform value Kj in response to the readout address j. When the read-out address j reaches the maximum value n, the read-out address j returns to 1 upon the next pulse. Therefore, the n number of waveform values K1-Kn are read out sequentially and cyclically from the RAM 122.

The waveform value Kj read out from the RAM 122 is held in the latch 124 and converted to an analog signal by the D/A converter 126. The analog signal output by the D/A converter 126 is amplified by the voltage amplifier 128 and output as a sine wave clock signal Swave.

Because the sine wave clock signal Swave is generated synchronously with the variable clock signal VCLK, it has a cycle period proportional to the cycle period of the variable clock signal VCLK. Because the entire sine wave clock generator 120 operate based on the variable power supply voltage Vvar supplied to its power supply voltage terminal Vddin, the peak voltage Ep of the sine wave clock signal Swave also takes a value proportional to the variable power supply voltage Vvar. More specifically, the peak voltage Ep of the sine wave clock signal Swave takes a value comprising the product of the maximum value Kmax of the waveform value Kj and the variable power supply voltage Vvar (i.e., Kmax×Vvar) or a value proportional thereto.

Figure 4:
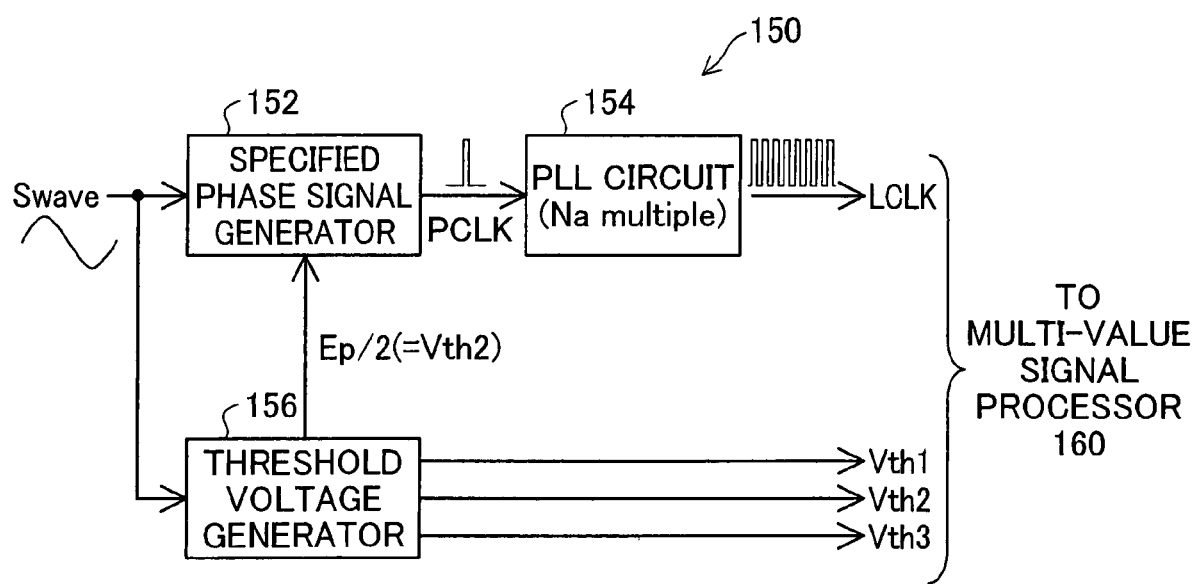
FIG. 4 is a block diagram showing the internal construction of a local clock generator.

FIG. 4 is a block diagram showing the internal construction of the local clock generator 150 (see FIG. 1). The local clock generator 150 has a specified phase signal generator 152, a PLL circuit 154 and a threshold voltage generator 156. The specified phase signal generator 152 generates a cyclic specified phase signal PCLK that indicates a specified phase of the sine wave clock signal Swave. The 'specified phase' may be the phase at the peak position or the phase at the central position (the so-called zero cross point) of the sine wave clock signal Swave.

The PLL circuit 154 generates a local clock pulse signal LCLK by multiplying the frequency of the specified phase signal PCLK by Na. The value of the integer Na is preferably a prescribed fixed value, but may be freely set by the CPU 130. As described below, in this embodiment, the cycle period of the specified phase signal PCLK is ½ of the cycle period of the sine wave clock signal Swave, and thus the cycle period of the local clock pulse signal LCLK is 1/(2×Na) of the cycle period of the sine wave clock signal Swave. However, in general the cycle period of the local clock pulse signal LCLK may be set to a value equal to 1/N of the cycle period of the sine wave clock signal Swave where N is a value of 2 or larger. Where it is desired to set the value of N to a number that is not an integer, a frequency divider may be added in front of the PLL circuit 154. In this construction, the value of N can be set to any number, which could be a decimal number, by adjusting the division ratio of the additional frequency divider and the multiplier Na of the PLL circuit 154. The value of N may be set to a value common to the multiple local clock generators 150 or may be set independently for individual local clock generators 150. In the latter case, a local clock pulse signal LCLK having a frequency appropriate to each circuit unit that includes a local clock generator 150 can be obtained.

The local clock pulse signal LCLK is supplied to other circuit elements disposed near the local clock generator 150. For example, the local clock pulse signal LCLK generated by the local clock generator 150 inside the CPU 130 is supplied to each circuit element in the CPU 130. Therefore, the circuit elements in the CPU 130 operate synchronously with this local clock pulse signal LCLK. The local clock pulse signal LCLK generated by the local clock generator 150 in the memory circuit 140 is supplied to each circuit element in the memory circuit 140, and as a result, the circuit elements in the memory circuit 140 operate synchronously with this local clock pulse signal LCLK. In this Specification, the circuits that operate synchronously with a local clock pulse signal LCLK are referred to as the 'local clock-synchronous circuits' or simply 'clock-synchronous circuits'.

The threshold voltage generator 156 generates multiple threshold voltages Vth1-Vth3 by analyzing the changes in the level of the sine wave signal Swave. These threshold voltages Vth1-Vth3 are supplied to and used by the multi-value signal processing circuit 160 (see FIG. 1). One of these threshold voltages, namely the threshold voltage Vth2, is also supplied to the specified phase signal generator 152.

Figure 5A:
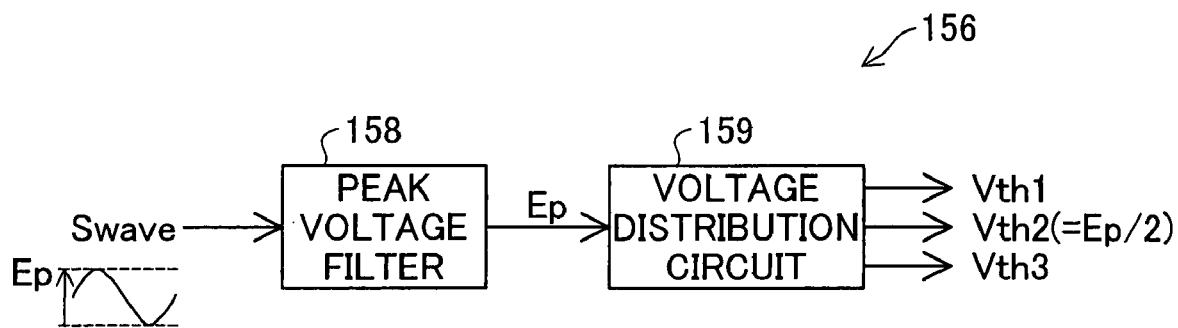
FIGS. 5A and 5B are block diagrams showing the internal construction of a threshold voltage generator.
Figure 5B:
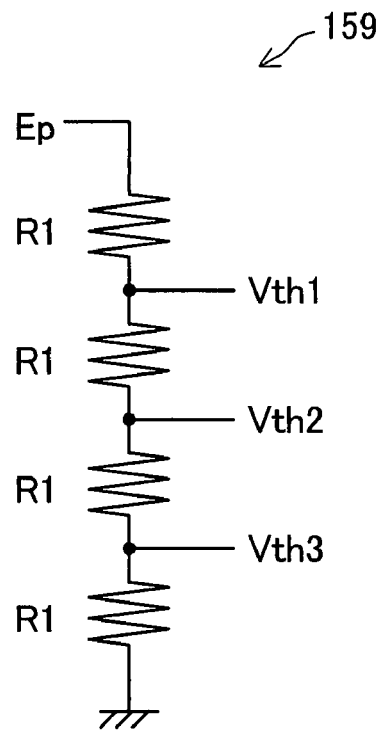

FIG. 5A is a block diagram showing the internal construction of the threshold voltage generator 156 (see FIG. 4). The threshold voltage generator 156 has a peak voltage filter 158 and a voltage distribution circuit 159. The peak voltage filter 158 is a circuit that detects the peak voltage Ep of the sine wave clock signal Swave. This peak voltage Ep is divided by the voltage distribution circuit 159 to generate multiple threshold voltages Vth1-Vth3. FIG. 5B shows one example of the voltage distribution circuit 159. In this example, the multiple threshold voltages Vth1-Vth3 are generated from the peak voltage Ep by four resistors R1. The number of the threshold voltages is not limited to three, and may be set to any number. A circuit construction having multiple voltage distribution circuits that generate different numbers of threshold voltages may be employed such that one of the voltage distribution circuits is selected and the threshold voltages output from the selected voltage distribution circuit is used.

FIGS. 6A through 6F are timing charts showing an example of the operation of the specified phase signal generator 152 (see FIG. 4). FIG. 6A shows the sine wave clock signal Swave. FIG. 6B shows the comparison signal S110 that is obtained from comparison of the sine wave clock signal Swave and the threshold voltage Ep/2. This comparison signal S110 is a pulse signal that has a falling edge and a rising edge at the centers of the sine wave clock signal Swave (i.e., the point equivalent to the zero-cross point of a regular AC sine wave signal). FIG. 6C shows the top peak signal S111U that is obtained from this comparison signal S110. The top peak signal S111U is a pulse signal that indicates the positions of the top peaks of the sine wave clock signal Swave. FIG. 6D shows a reverse signal /S110 of the comparison signal S110 while FIG. 6E shows the bottom peak signal S111D that is obtained from this reverse signal /S110. The bottom peak signal S111D is a pulse signal that indicates the positions of the bottom peaks of the sine wave clock signal Swave. FIG. 6F is a specified phase signal PCLK that is obtained by seeking the logical sum of the top peak signal S11U and the bottom peak signal S111D. This specified phase signal PCLK is a pulse signal that indicates the positions of the top and bottom peaks of the sine wave clock signal Swave. In other words, this specified phase signal PCLK is a signal that indicates the timing at which the phase of the sine wave clock signal Swave becomes $(m+\frac{1}{2})\pi$, where m is any integer.

FIGS. 7A through 7C are timing charts showing another example of the operation of the specified phase signal generator 152. In this example, the pulses of the specified phase signal PCLK are generated in accordance with the rising and falling edges of the comparison signal S110. It is seen that this specified phase signal PCLK is a signal that indicates the timing at which the phase of the sine wave clock signal Swave becomes $m\pi$, where m is any integer. The two specified phase signals PCLK shown in FIG. 6F and FIG. 7C are signals through which a pulse is generated at each specific phase difference (here, the difference is $\pi$) in the sine wave clock signal Swave. Therefore, by multiplying the frequency of either specified phase signal PCLK by Na via the PLL circuit 154, the same local clock pulse signal LCLK can be obtained. This local clock pulse signal LCLK is supplied to the multi-value signal processing circuit 160 (see FIG. 1) together with the multiple threshold voltages Vth1-Vth3.

Figure 8:
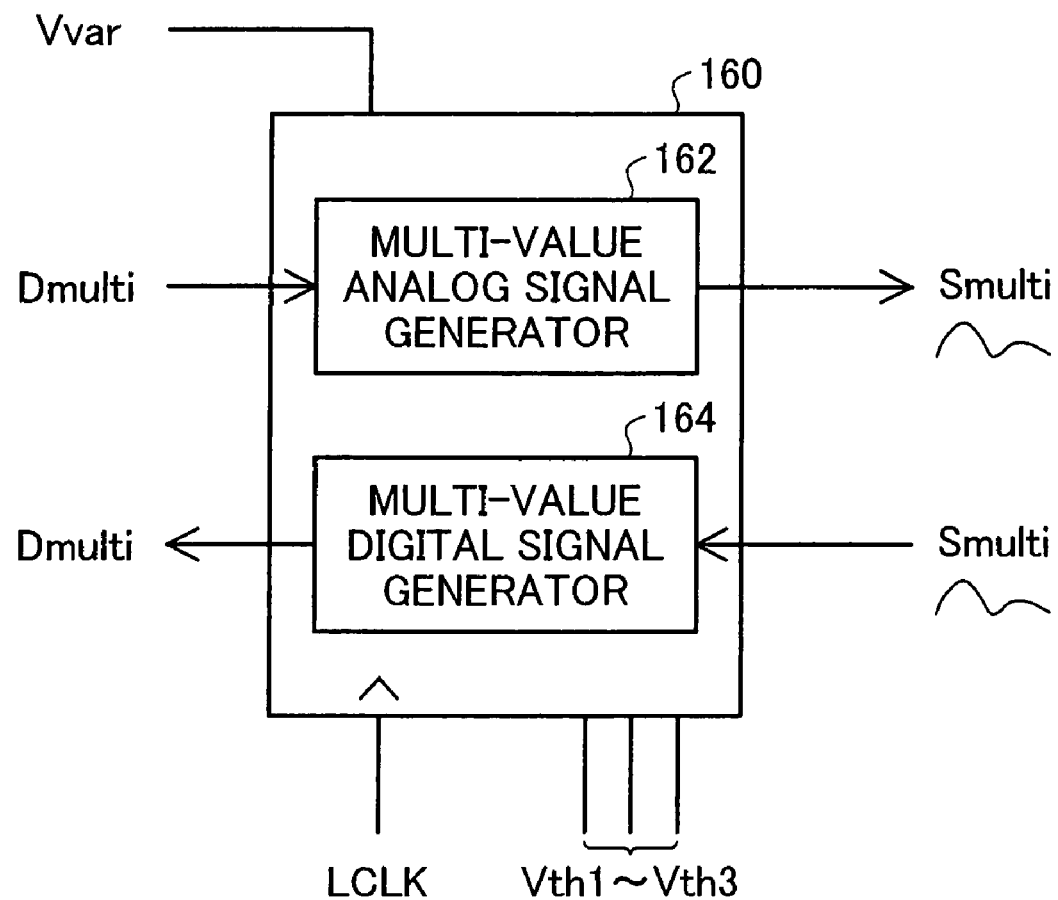
FIG. 8 is a block diagram showing the internal construction of a multi-value signal processing circuit.

FIG. 8 is a block diagram showing the internal construction of the multi-value signal processing circuit 160 (see FIG. 1). The multi-value signal processing circuit 160 includes a multi-value analog signal generator 162 and a multi-value digital signal generator 164. When the multi-value digital signal Dmulti is received from an internal circuit, the multi-value analog signal generator 162 converts these multi-value digital signals Dmulti into multi-value analog signals Smulti, and outputs them to an external circuit. Here, 'internal circuit' refers to another circuit that exists in the circuit unit (for example, the same chip) to which the multi-value signal processing circuit 160 belongs. Specifically, the 'internal circuit' for the multi-value signal processing circuit 160 in the CPU 130 means another circuit inside the CPU 130. 'External circuit' means a circuit that exists outside the circuit unit to which the multi-value signal processing circuit 160. Specifically, the 'external circuit' for the multi-value signal processing circuit 160 in the CPU 130 means a circuit (for example, the memory circuit 140) other than the CPU 130. When the multi-value analog signals Smulti are received from the external circuit, the multi-value digital signal generator 164 converts these multi-value analog signals Smulti into multi-value digital signals Dmulti and sends them to an internal circuit. The multi-value analog signals Smulti are signals having three or more multiple value signal levels.

Figure 9:
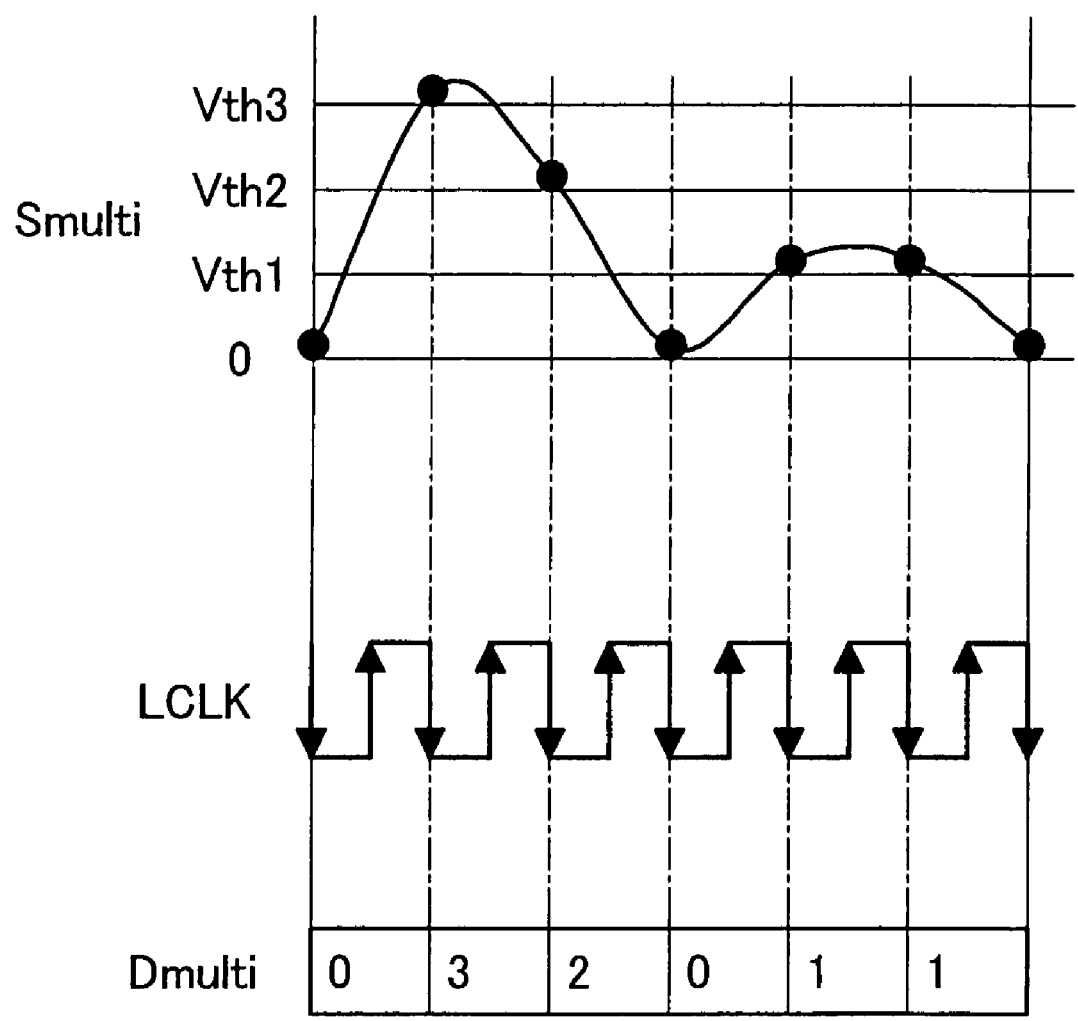
FIG. 9 is a timing chart showing an example of the operation of a multi-value digital signal generator.

FIG. 9 is a timing chart showing an example of the operation of the multi-value digital signal generator 164 (see FIG. 8). The multi-value analog signals Smulti undergo A/D conversion at the falling edges of the local clock pulse signal LCLK. The multiple threshold voltages Vth1-Vth3 supplied from the local clock generator 150 (see FIG. 4) are used in this A/D conversion. In other words, the level of the multi-value analog signals Smulti is compared with the multiple threshold voltages Vth1-Vth3, and a multi-value digital signal Dmulti is generated through the A/D conversion. For the multi-value digital signal generator 164, any of various types of A/D converters may be used. The multi-value analog signal generator 162 generates multi-value analog signals Smulti via the essentially reverse operation from FIG. 9.

The reason that the threshold voltages Vth1-Vth3 obtained by the local clock generator 150 (see FIG. 4) are used in the A/D conversion and D/A conversion executed inside the multi-value signal processing circuit 160 is described below. The circuit units (the CPU 130 and the memory circuit 140) that include a multi-signal processing circuit 160 operate based on the variable power supply voltage Vvar, and the multi-value signal processing circuits 160 also operate based on this variable power supply voltage Vvar. Therefore, the multi-value level of the multi-value analog signals Smulti generated by the multi-value analog signal generator 162 is proportional to the variable power supply voltage Vvar. Similarly, the peak voltage Ep of the sine wave clock signal Swave generated by the sine wave clock generator 120 also is proportional to the variable power supply voltage Vvar (see FIG. 3). Therefore, the A/D conversion and D/A conversion regarding the multi-value analog signals Smulti can be properly executed using the threshold voltages Vth1-Vth3 that are obtained by dividing the peak voltage Ep of the sine wave clock signal Swave which is detected by the local clock generator 150 (FIG. 4).

The threshold voltages used by the multi-value signal processing circuits 160 may be generated from the variable power supply voltage Vvar. In other words, the threshold voltages used by the multi-value signal processing circuits 160 may be generated using the variable power supply voltage Vvar itself or a voltage that changes in proportion to the variable power supply voltage Vvar (the peak voltage Ep of the sine wave clock signal Swave, for example).

The multi-value signal processing circuits 160 is also applicable to a system that uses a fixed power supply voltage instead of the variable power supply voltage Vvar. In this case, a fixed voltage level or levels may be used as one or more threshold voltages used by the multi-value signal processing circuit 160.

As described above, in this embodiment, a sine wave clock signal Swave is transmitted to multiple circuit units (the CPU 130 and the memory circuit 140) in the device as a common clock signal, and it is not necessary to provide high-frequency clock pulses to these circuit units. Therefore, high-harmonic noise caused by the transmission of high-frequency clock pulses and the problem of deterioration of the clock pulse waveform entailed by the transmission can also be avoided. In addition, in order to reduce high-harmonic noise, it is preferred that the variable voltage/variable clock generator 110 and the sine wave clock generator 120 be implemented on the same chip to shorten the transmission distance for the variable clock signal VCLK.

While it is preferred that this sine wave clock signal Swave be sent to as many circuits as possible inside the device, it need not be transmitted to all circuits, and it is acceptable if the sine wave clock signal Swave is transmitted to one or more pre-selected circuits.

As described above, in this embodiment, the frequencies of the variable clock signal VCLK and the local clock signal LCLK change in proportion to the voltage level of the variable power supply voltage Vvar. Therefore, power consumption by each circuit can be efficiently reduced via the operation and effect of the voltage level of the variable power supply voltage Vvar and the clock frequencies.

Furthermore, in this embodiment, the CPU 130 and the memory circuit 140 each have a multi-value signal processing circuit 160 and execute data transfer using multi-value analog signals Smulti. Therefore, in comparison with a situation where digital signals are transferred, information can be transferred more rapidly via each signal line. The number of transfer signal lines for the multi-value analog signals Smulti can be freely set in accordance with the amount of information to be sent at one time (i.e., the transfer bit width).

B. Internal Construction and Operation of Specified Signal Generator

Figure 10:
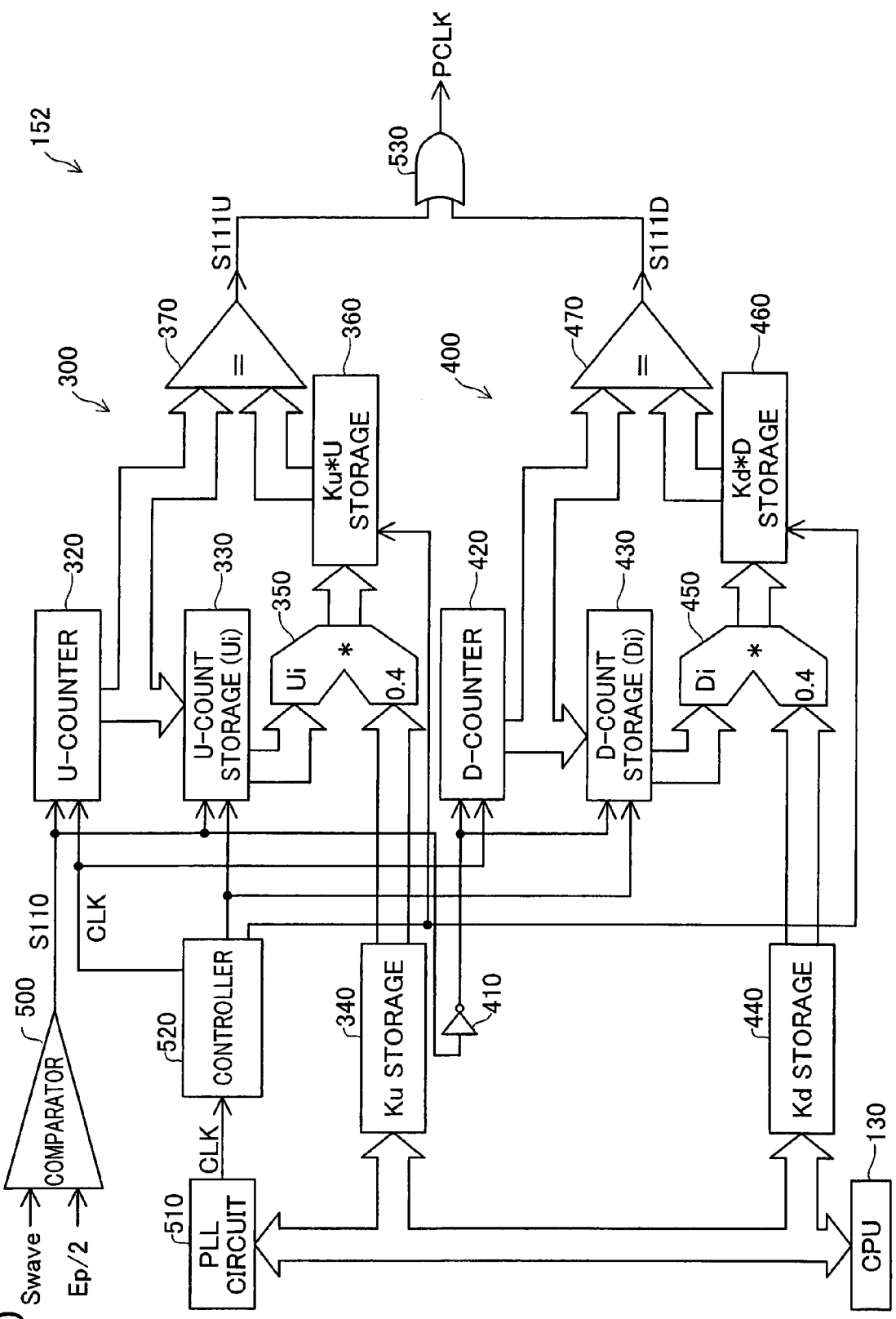
FIG. 10 is an explanatory drawing showing the internal construction of a specified phase signal generator.

FIG. 10 is an explanatory drawing showing one example of the internal construction of the specified phase signal generator 152 (see FIG. 4). This specified phase signal generator 152 includes a top peak detector 300, a bottom peak detector 400, a comparator 500, a PLL circuit 510, a controller 520 and an OR circuit 530. The comparator 500 compares the sine wave clock signal Swave and the threshold voltage Ep/2 to generate the comparison signal S110 (see FIG. 6B).

The upper peak detector 300 includes a counter 320, a counter value storage 330, a coefficient value storage 340, a multiplication circuit 350, an operation result storage unit 360 and a comparator 370. The bottom peak detector includes an inverter (NOT circuit) 410, a counter 420, a counter value storage 430, a coefficient value storage 440, a multiplication circuit 450, an operation result storage 460, and a comparator 470. It is understood that the bottom peak detector 400 comprises the top peak detection unit 300 plus the inverter 410. This inverter 410 is used to reverse the comparison signal S110 and supply it to the counter 420. The corresponding elements of the top peak detector 300 and the bottom peak detector 400 respectively have identical functions. The PLL circuit 510 functions as a clock signal generator that generates the clock signal CLK used in the specified phase signal generator 152. The controller 520 supplies this clock signal CLK to the counters 320, 420 and also supplies appropriate holding timing (latch timing) to the counter value storages 330, 430, and the coefficient value storages 360, 460. The top peak detector 300 generates a first detection signal S111U (also referred to as the 'top peak signal') that substantially indicates the top peak positions of the sine wave clock signal Swave. The bottom peak detector 400 generates a second detection signal S111D (also referred to as a 'bottom peak signal') that substantially indicates the bottom peak positions of the sine wave clock signal Swave. The OR circuit generates an ultimate specified phase signal (also referred to as the 'peak signal') PCLK by obtaining the logical sum of these two detection signals S111U and S111D. Because the operations of the top peak detector 300 and the bottom peak detector 400 are substantially the same, the operation of only the top peak detector 300 will be described below.

Figure 11:
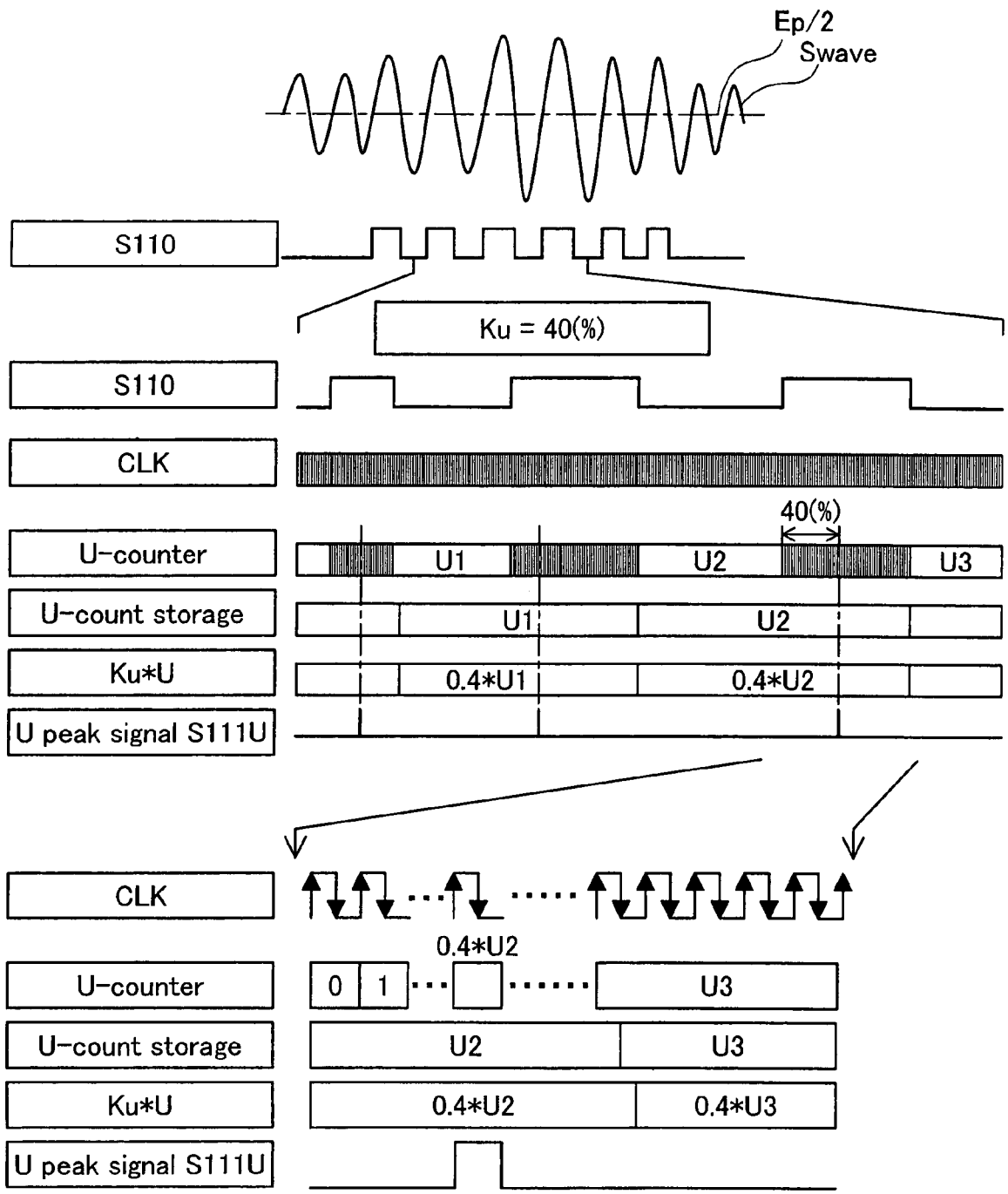
FIG. 11 is a timing chart showing the operation of a top peak detection unit.

FIG. 11 is a timing chart showing the operation of the top peak detector 300. The top peak detector 300 operates as described below. First, the counter 320 receives the comparison signal S110, and based on the clock signal CLK supplied from the controller 520, sequentially counts the number of clock pulses during the period in which the comparison signal S110 is at high level and sequentially outputs the obtained counter value to the comparator 370. When the comparison signal S110 changes from high level to low level, the counter 320 causes the counter value Ui, where i is the cycle number, at that time to be stored in the counter value storage 330.

While the frequency of the sine wave clock signal Swave changes dramatically in the example shown in FIG. 11, if the division value Ma (see FIG. 2) of the variable voltage/variable clock generator 110 does not change, the sine wave clock signal Swave becomes a clean sine wave having a fixed cycle. This holds true with regard to FIGS. 12-14 as well.

The coefficient value storage 340 stores the coefficient value Ku set by the CPU 130. The multiplication circuit 350 multiplies the counter value Ui stored in the counter value storage 330 by the coefficient value Ku stored in the coefficient value storage 340, and causes the operation result thus obtained to be stored in the operation result storage 360. In the example shown in FIGS. 10 and 11, Ku=0.4. The comparator 370 generates and outputs the top peak signal S111U and compares the counter value sequentially input from the counter 320 and the operation result (=Ui×Ku) stored in the operation result storage 360. Where these match each other, the comparator 370 causes the top peak signal S111U to be high level for a prescribed period of time.

Figure 12:
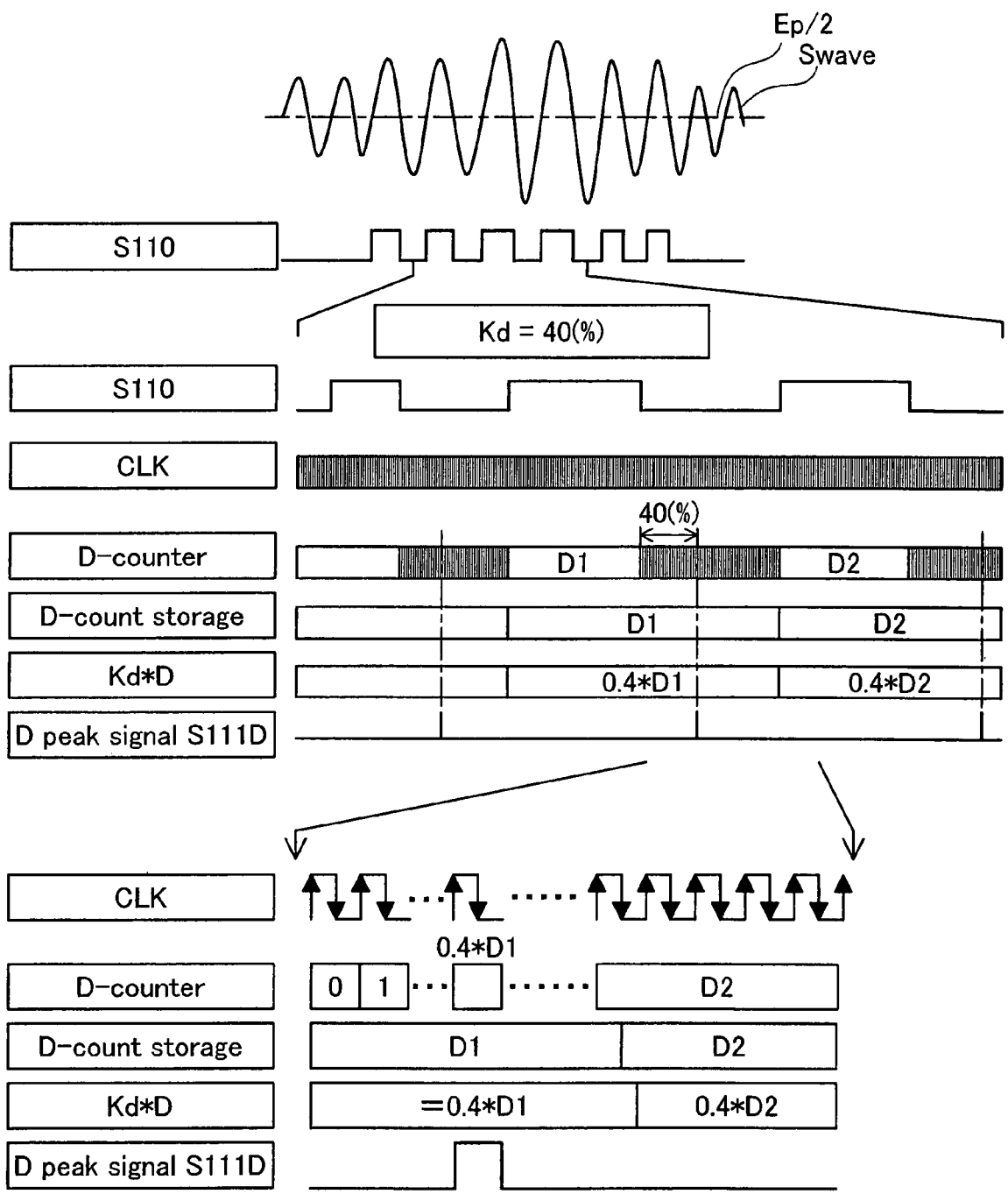
FIG. 12 is a timing chart showing the operation of a bottom peak detection unit.

FIG. 12 is a timing chart showing the operation of the bottom peak detector 400. Because the operation of the bottom peak detector 400 is the same as the operation of the top peak detector 300 except that a reversed signal of the comparison signal S110 is used, it will not be described in detail.

Figure 13:
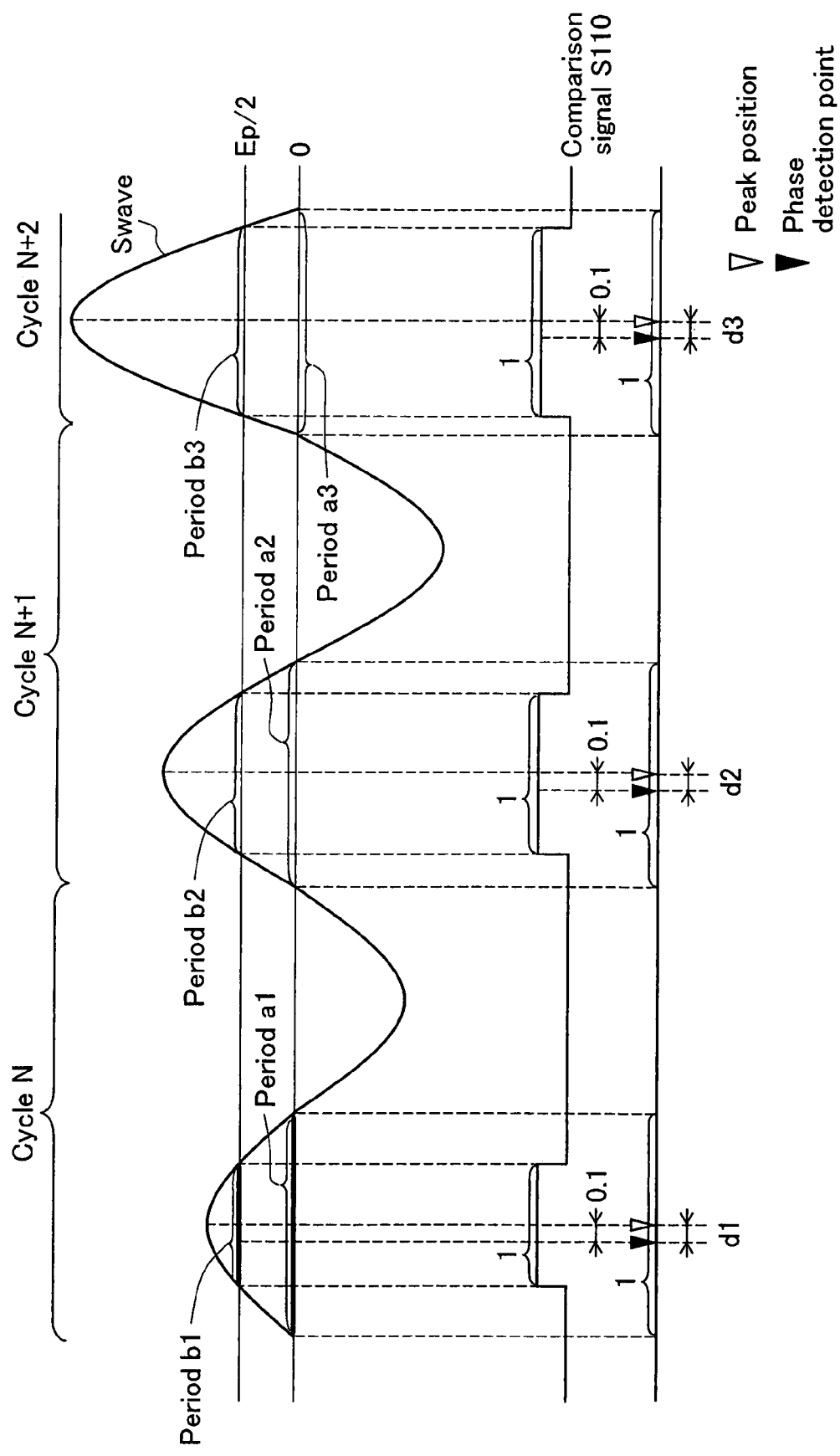
FIG. 13 is an explanatory drawing showing in a summary fashion specified phase detection during the first half of each cycle of a sine wave clock signal.

FIG. 13 is an explanatory drawing showing in a summary fashion the specified phase detection in the first half of each cycle of the sine wave clock signal Swave in this embodiment. In FIG. 13, the upper part shows the waveform of the sine wave clock signal Swave while the lower part shows the comparison signal S110. The white triangles indicate the peak positions, and the black triangles indicate the positions that are detected as substitutes for the peak positions and are used as reference points for phase comparison (hereinafter referred to as the 'phase detection points').

In the first cycle N (0-2π) in FIG. 13, the period a1 indicates the first half of the cycle (0-π) while the period b1 indicates a period in which the comparison signal S11 is at high level. The periods a2, b2 in cycle N+1 and the periods a3, b3 in cycle N+2 are the same as the periods a1, b2 described above, and therefore they will not be described in detail.

Because the sine wave clock signal Swave has a sine wave form, the peak position, which is the center position (π/2) of the period a1, and the center position of the period b1 match each other. Therefore, the position that is offset from the center by 0.1 when the period b1 is deemed '1' is equivalent to the position that is offset by the period d1 which is a prescribed distance away from the peak position when the period a1 is deemed '1'. Here, the position in period b1 that is offset from the center by 0.1 is equivalent to 20% before the center when the period from the start position to the center of the period b1 is deemed 100%, and is relatively close to the center. Because this position is relatively close to the peak position in the period a1 as well, the period d1 is a value close to 0.1.

Similarly, with regard to the next cycle N+1 as well, the position that is offset by 0.1 from the center in the period b2 when the period b2 is deemed '1' is equivalent to the position in the period a2 that is offset from the peak position by the period d2 when the period a2 is deemed '1', and this period d2 also is a value close to 0.1. In addition, with regard to cycle N+2 as well, the period d3 shown in FIG. 13 also is a value close to 0.1 as described above.

As described above, when the position that is offset from the center by 0.1 in each period during which the comparison signal S110 is at high level, i.e., the position that is 20% of the period before the center, is deemed the phase detection point, the phase detection point is a position that is offset from the top peak position (with the phase π/2) by 0.1 in each cycle. The locations of such positions are constant relative to the top peak positions. Therefore, the positions that are offset by 0.1 from the centers of the periods during which the comparison signal S110 is at high level can be used as the phase detection points. However, it is also acceptable if the centers of the periods during which the comparison signal S110 is at high level are used as the phase detection points.

Figure 14:
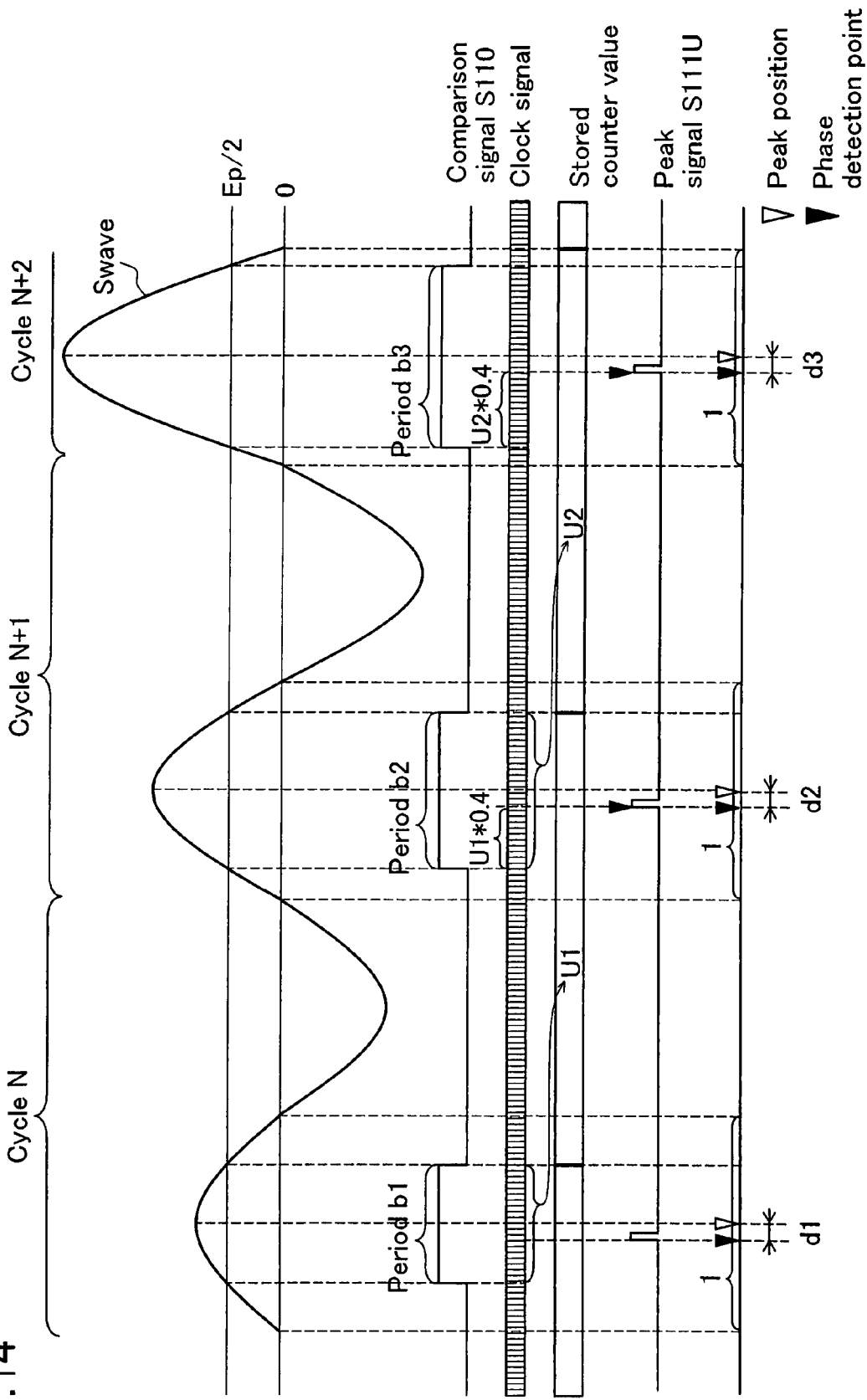
FIG. 14 is an explanatory drawing showing in a simplified fashion the top peak signal generating operation and the phase detection point determination method.

FIG. 14 is an explanatory drawing showing in a simplified fashion the operation to generate the top peak signal S111U and the method to determine the phase detection points. In FIG. 14, the upper part shows the waveform of the sine wave clock signal Swave and the lower part shows the comparison signal S110, the clock signal output by the PLL circuit 510 shown in FIG. 10, the counter value Ui stored in the counter value storage 330, the top peak signal S111U, the phase detection points and the peak positions.

We will now examine the time at which the cycle N+1 begins. At this time, in the cycle N, which is immediately before the cycle N+1, the counter 320 (see FIG. 10) counts the number of clock pulses in the period b1 shown in FIG. 14, causes the obtained counter value U1 to be stored in the counter value storage 330, and at the same time, the multiplication circuit 350 causes 'U1*0.4', which is obtained by multiplying the counter value 'U1' by the coefficient value '0.4' stored in the coefficient value storage 340, to be stored in the operation result storage 360.

When cycle N+1 begins and the sine wave clock signal Swave reaches the threshold value Ep/2, the comparison signal S110 rises to high level and the counter 320 begins counting the number of clock pulses. The comparator 370 sequentially compares the counter value obtained by the counter 320 and the 'U1*0.4' value stored in the calculation result storage unit 360. When the counter value comes to equal to 'U1*0.4', the comparator 370 causes the top peak signal S111U to rise to high level for a prescribed period of time. When the comparison signal S110 falls to low level from high level and when the period b2 ends, the counter 320 overwrites the previous counter value 'U1' with a new counter value U2 at that time and causes it to be stored in the counter value storage unit 330. The multiplication circuit 350 multiplies this counter value 'U2' by the coefficient value '0.4' stored in the coefficient value storage 340, and causes the 'U2*0.4' value thus obtained to be overwritten over the currently stored 'U1*0.4' and stored in the operation result storage 360.

As shown in FIG. 14, if the change of a time period where the comparison signal S110 is at high level is small, and particularly when the frequency of the sine wave clock signal Swave is kept constant, the amplitude of the sine wave clock signal Swave also is constant and stays constant during high level periods. Therefore, the periods d1-d3 shown in FIG. 14 all become almost '0.1' when half a cycle (0-π) is deemed '1', and the position of each phase detection point relative to the top peak position becomes substantially constant. It is possible to generate the pulses of the top peak signal S111U at timings that indicate the top peaks themselves. In this case, the coefficient value stored in the coefficient value storage unit 340 should be made '0.5'. The same holds true regarding the bottom peak positions.

The OR circuit shown in FIG. 10 generates the specified phase signal PCLK by obtaining the logical sum of the top peak signal S111U and the bottom peak signal S111D thus obtained. In this way, the specified phase signal generator 152 can generate a specified phase signal PCLK having constant positions relative to the peak positions.

C. Variations

The present invention is not limited to the examples and embodiments described above, and may be implemented in various other forms within the scope thereof, including the following variations, for example.

C1. Variation 1

In the embodiment described above, the following multiple characteristic features are related to one another, but it is possible to construct a device that has only some of these features:

(1) Use of a variable power supply voltage Vvar;
(2) Use of a variable clock signal VCLK;
(3) Transfer of a sine wave clock signal Swave and generation of a local clock pulse signal LCLK from the sine wave clock signal Swave; and
(4) Use of a multi-value signal processing circuit 160.

Specifically, for example, while the level of the variable power supply voltage Vvar and the cycle period of the sine wave clock signal Swave are proportional to each other, these may be set independently. Specifically, it is acceptable if the cycle period of the sine wave clock signal Swave is maintained at a constant value regardless of the level of the variable power supply voltage Vvar. It is preferred in this case as well that the peak voltage Ep of the sine wave clock signal Swave be proportional to the level of the variable power supply voltage Vvar. It is also possible to use a sine wave clock signal Swave in a device that uses a fixed power supply voltage instead of a variable power supply voltage Vvar.

In the embodiment described above, the multi-value signal processing circuits 160 execute processing synchronously with the clock signal generated from the sine wave clock signal Swave, but it is also possible to use a multi-value signal processing circuit 160 in a device that does not use a sine wave clock signal Swave.

C2. Variation 2

In the embodiment described above, the cycle period or frequency of the sine wave clock signal is variable, but it is also acceptable if the cycle period or frequency of the sine wave clock signal is fixed. In addition, it is possible to use a analog clock signal having a cyclical analog waveform other than a sine wave in place of the sine wave clock. An 'analog waveform' here means a curved waveform that does not have rectangular waves. From the perspective of prevention of high-harmonic noise, it is preferred to use a sine wave clock signal.

C3. Variation 3

In the examples shown in FIGS. 1 and 8, the multi-value signal processing circuits 160 respectively disposed in two circuit units (the CPU 130 and the memory circuit 140) each includes a multi-value analog signal generator 162 and a multi-value digital signal generator 164, and each of the two circuits 130, 140 functioned as a transmission circuit and a receiving circuit. However, in general, it suffices if a multi-value analog signal generator 162 is disposed in a transmission circuit that transmits multi-value analog signals to other circuits and a multi-value digital signal generator 164 is disposed in a receiving circuit that receives multi-value analog signals and generates multi-value digital signals.

C4. Variation 4

The constructions of the circuits shown in FIGS. 1-5 and FIG. 8 are mere examples, and the internal construction, connections and installation positions of each circuit may be arbitrarily changed. For example, the variable voltage/variable clock generator 110 may be implemented as two separate circuits, i.e., as a variable voltage generator and a variable clock generator. The variable voltage/variable clock generator 110 and the sine wave clock generator 120 may be implemented together on one circuit or one chip. Furthermore, instead of having a local clock generator 150 in each individual multi-value signal processing circuit 160, a single local clock generator 150 may be used by multiple multi-value signal processing circuits 160.

C5. Variation 5

In the embodiment described above, the various signals are electric signals, but the present invention may also be applied in devices that use other types of signals, such as optical signals.

C6. Variation 6

The circuitries and devices according to the present invention are applicable to various portable appliances such as mobile phones, portable personal computers, and personal digital assistance devices. Where the present invention is implemented in a portable appliance, the various advantages mentioned previously (low power consumption, low high frequency noise) will be particularly notable. The circuitries and devices according to present invention are also applicable to mobile bodies such as motor vehicles, effecting the same advantages mentioned above.

Figure 15A:
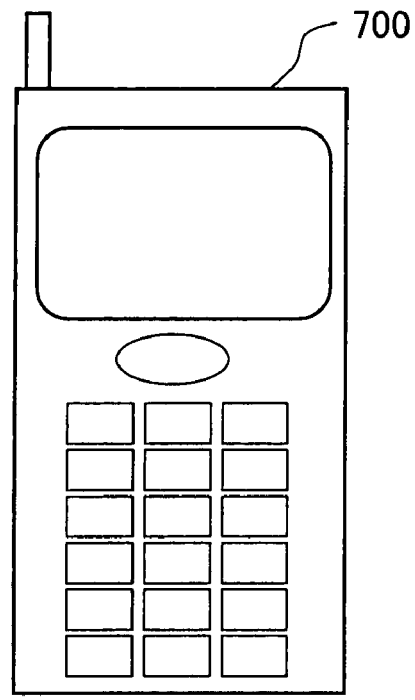
FIGS. 15A and 15B illustrate a mobile phone utilizing a motor according to the present invention.
Figure 15B:
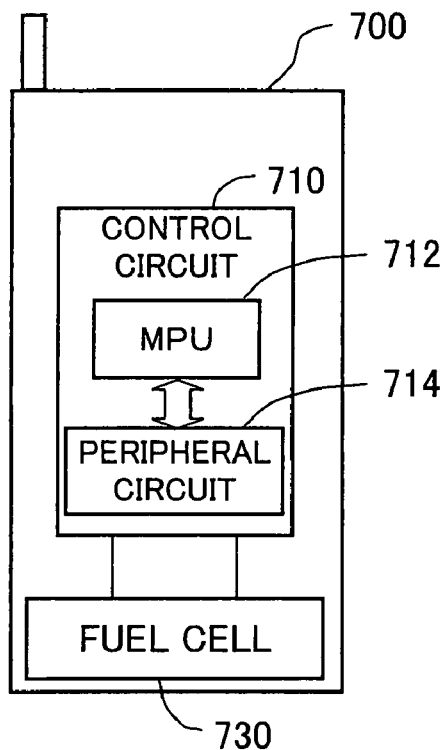

FIGS. 15A, and 15B illustrate a mobile phone utilizing a circuitry according to the present invention. FIG. 15A shows the external view of a mobile phone 700, and FIG. 15B shows its exemplary internal configuration. The mobile phone 700 includes a control circuit 710 for controlling the operation of the mobile phone 700, and a fuel cell 730. The fuel cell 730 supplies power to the control circuit 710. The control circuit 710 includes a MPU 712 and a peripheral circuit 714. The MPU 712 corresponds to the CPU 130 shown in FIG. 1, and the peripheral circuit 714 includes the circuits 110, 120, 130 and 140 of FIG. 1. The various operations described above will be performed within the control circuit 710.

Figure 16:
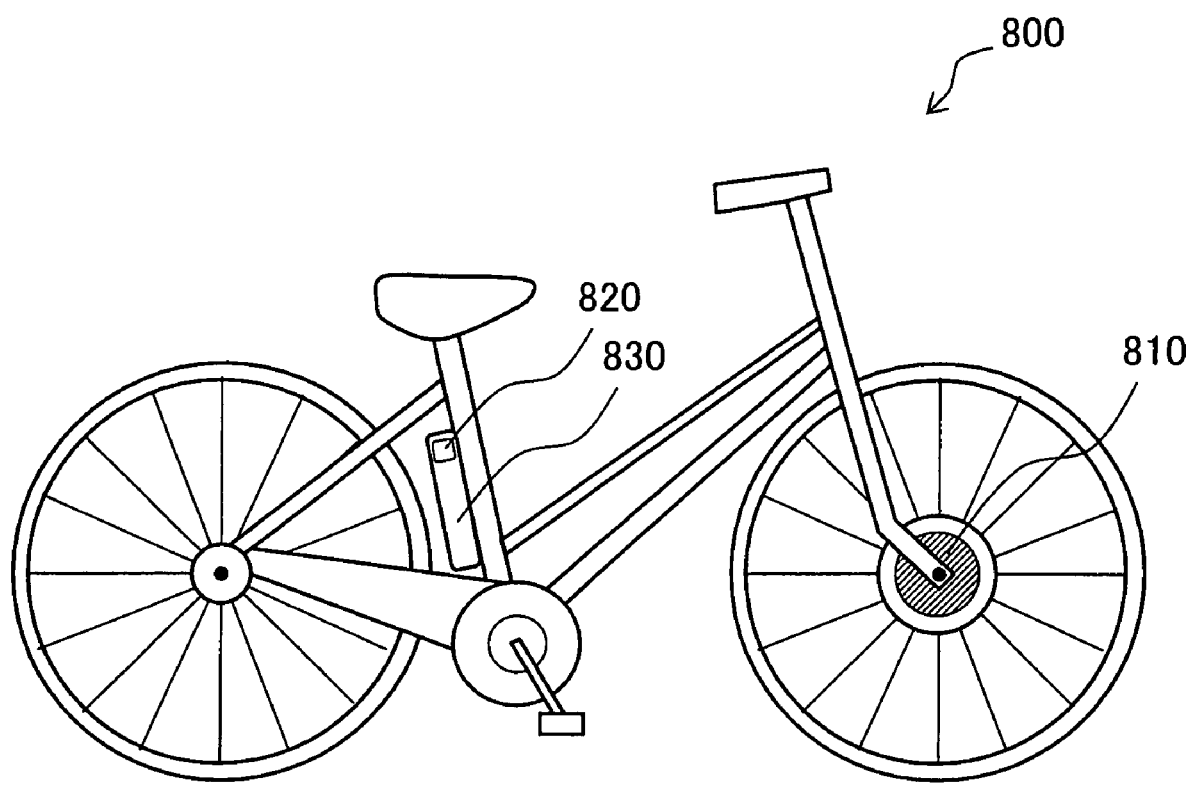
FIG. 16 illustrates an electric bicycle (electric-assisted bicycle) utilizing a motor according to the present invention.

FIG. 16 illustrates an electric bicycle (electric-assisted bicycle) as an example of a moving body utilizing a circuitry according to the present invention. The bicycle 800 includes a motor 810 at the front wheel, and a control circuit 820 and a rechargeable battery 830 both attached on the frame under the saddle. The motor 810 powered by the battery 830 drives the front wheel to assist the run. During braking, the regenerated power by the motor 810 is charged in the battery 830. The control circuit 820 controls the drive and regeneration of the motor 810. The control circuit 820 includes the circuits 110, 120, 130 and 140 of FIG. 1. The various operations described above will be performed within the control circuit 820.

What is claimed is:

1. A circuitry for transferring data, comprising:
   a variable power supply voltage generator for generating a variable power supply voltage;
   a transmitting circuit operative at the variable power supply voltage for generating a multi-value analog signal and transmitting the multi-value analog signal to other circuits;
   a receiving circuit operative at the variable power supply voltage for receiving the multi-value analog signal and performing A/D conversion to re-generate a multi-value digital signal; and
   a threshold voltage generator for generating threshold voltages used for the A/D conversion and supplying the threshold voltages to the receiving circuit, the threshold voltages being generated from the variable power supply voltage or from a signal having a voltage value proportional to the variable power supply voltage.

2. The circuitry according to claim 1, further comprising:
   a sine wave clock generator for generating a sine wave clock signal and sending the sine wave signal to the transmitting circuit and the receiving circuit, the sine wave clock signal having a cycle period that increases as the variable power supply voltage decreases, wherein the transmitting circuit and the receiving circuit respectively generate a clock pulse signal having a cycle period equal to 1/N of the cycle period of the sine wave clock signal where N is a value of 2 or greater, and perform operations in synchronism with the clock pulse signal.

3. The circuitry according to claim 2, wherein the sine wave clock signal has a peak voltage proportional to the variable power supply voltage, and the threshold voltage generator generates the threshold voltages based on the peak voltage of the sine wave clock signal.

4. A device comprising the circuitry according to claim 1.

5. The device according to claim 4, wherein the device is a mobile appliance.

6. The device according to claim 4, wherein the device is a moving body.

7. A circuitry that uses clock pulses, comprising:

an analog clock generator for generating an analog clock signal having a cyclical analog waveform;

a clock pulse generator for generating, responsive to the analog clock signal, a clock pulse signal having a cycle period equal to 1/N of a cycle period of the analog clock signal where N is a value of 2 or greater; and a clock-synchronous circuit operative in synchronism with the clock pulse signal;

wherein the analog clock generator is operative to change the cycle period of the analog clock signal, and the cycle period of the clock pulse signal is changed according to the change in the cycle period of the analog clock signal.

8. The circuitry according to claim 7, comprising a plurality of the clock-synchronous circuits including first and second clock-synchronized circuits, wherein the clock pulse generator is disposed in each clock-synchronous circuit.

9. The circuitry according to claim 8, wherein the value N is established independently for each clock pulse generator.

10. The circuitry according to claim 8, wherein the first clock-synchronous circuit includes a multi-value analog signal generator for generating a multi-value analog signal that represents digital values to be transmitted to the second clock-synchronous circuit, the multi-value analog signal generator being operative in synchronism with a first clock pulse signal generated by a first clock pulse generator that is disposed for the first clock-synchronous circuit, and the second clock-synchronous circuit includes a multi-value digital signal generator for converting the multi-value analog signal into a multi-value digital signal, the multi-value digital signal generator being operative in synchronism with a second clock pulse signal generated by a second clock pulse generator that is disposed for the second clock-synchronous circuit.

11. The circuitry according to claim 7, wherein the analog clock signal has a sine wave waveform.

12. A device comprising the circuitry according to claim 7.

13. The device according to claim 12, wherein the device is a mobile appliance.

14. The device according to claim 12, wherein the device is a moving body.

15. A method for generating clock pulses, comprising the steps of:

(a) generating an analog clock signal having a cyclical analog sine wave waveform, and (b) generating, response to the analog clock signal, a clock pulse signal having a cycle period equal to 1/N of a cycle period of the analog clock signal where N is a value of 2 or greater, wherein the generation of the analog clock signal is operative to change the cycle period of the analog clock signal, and the cycle period of the clock pulse signal is changed according to the change in the cycle period of the analog clock signal.

* * * * *